US012635535B2

(12) United States Patent
Lin et al.

(10) Patent No.: US 12,635,535 B2
(45) Date of Patent: May 19, 2026

(54) MULTI-LEVEL STAGGERED TERMINAL STRUCTURE AND SEMICONDUCTOR PACKAGE AND ASSEMBLY USING THE SAME

(71) Applicant: BRIDGE SEMICONDUCTOR CORP., Taipei City (TW)

(72) Inventors: Charles W. C. Lin, Singapore (SG); Chia-Chung Wang, Hsinchu County (TW)

(73) Assignee: BRIDGE SEMICONDUCTOR CORP., Taipei City (TW)

( * ) Notice: Subject to any disclaimer, the term of this patent is extended or adjusted under 35 U.S.C. 154(b) by 453 days.

(21) Appl. No.: 18/468,337

(22) Filed: Sep. 15, 2023

(65) Prior Publication Data

US 2024/0096780 A1     Mar. 21, 2024

Related U.S. Application Data

(60) Provisional application No. 63/407,449, filed on Sep. 16, 2022.

(51) Int. Cl.
| | |
|---|---|
| *H01L 23/498* | (2006.01) |
| *H01L 23/00* | (2006.01) |
| *H10W 70/40* | (2026.01) |
| *H10W 72/00* | (2026.01) |
| *H10W 90/00* | (2026.01) |

(52) U.S. Cl.
CPC ........ *H10W 70/479* (2026.01); *H10W 72/884* (2026.01); *H10W 90/736* (2026.01); *H10W 90/754* (2026.01)

(58) Field of Classification Search
CPC ......... H01L 23/49861; H01L 23/49548; H01L 23/49582; H01L 24/32; H01L 21/4832
See application file for complete search history.

(56) References Cited

U.S. PATENT DOCUMENTS

| | | | |
|---|---|---|---|
| 7,102,214 B1 | 9/2006 | Miks et al. | |
| 8,338,922 B1 | 12/2012 | Sirinorakul et al. | |
| 8,597,983 B2 * | 12/2013 | Gong ................. | H01L 21/4853 257/676 |
| 2012/0091568 A1 * | 4/2012 | Ong Wai Lian .... | H01L 23/4952 257/673 |

(Continued)

*Primary Examiner* — Mounir S Amer
(74) *Attorney, Agent, or Firm* — Muncy, Geissler, Olds & Lowe, P.C.

(57) ABSTRACT

A terminal structure includes an electrically conductive post, an electrically conductive flange, and a stress buffer. The electrically conductive post has a bottom surface at a first level and an upper sidewall laterally covered by the stress buffer. The stress buffer has a bottom surface at a second level between the top surface and the bottom surface of the electrically conductive post. The electrically conductive flange extends laterally from the upper sidewall of the electrically conductive post to an outer peripheral edge thereof, and has a depression surface at a third level between the top surface and the bottom surface of the electrically conductive post. Accordingly, the terminal structure has multi-level staggered configuration and is advantageous to achieving the desired wetting height for robust visual inspection and improving primary and secondary board-level reliability.

20 Claims, 11 Drawing Sheets

(56)  References Cited

U.S. PATENT DOCUMENTS

| | | | |
|---|---|---|---|
| 2014/0284779 A1* | 9/2014 | Hayata | H01L 24/85 |
| | | | 257/676 |
| 2017/0133353 A1* | 5/2017 | Lin | H01L 25/0657 |
| 2017/0263546 A1* | 9/2017 | Lin | H01L 23/49838 |
| 2018/0158770 A1* | 6/2018 | Lin | H01L 23/49861 |
| 2018/0190622 A1* | 7/2018 | Lin | H01L 23/49575 |

* cited by examiner

MULTI-LEVEL STAGGERED TERMINAL STRUCTURE AND SEMICONDUCTOR PACKAGE AND ASSEMBLY USING THE SAME

CROSS REFERENCE TO RELATED APPLICATION

This application claims the benefit of the filing date of U.S. Provisional Application Ser. No. 63/407,449 filed Sep. 16, 2022. The entirety of said Provisional Application is incorporated herein by reference.

FIELD OF THE INVENTION

The present invention relates to a terminal structure and, more particularly, to a multi-level staggered terminal structure of an interconnect substrate and a semiconductor package and a semiconductor assembly using the same.

DESCRIPTION OF RELATED ART

Recently, there has been a notable surge of interest in quad flat no-lead (QFN) packaging for high-power electric components. For conventional QFN, it is commonly acknowledged that the QFN lead would be cut in the QFN package singulation process, leaving the exposed cutting surface untreated and open to the atmosphere. Due to the susceptibility of the exposed sidewalls of leads to oxidation, solder wetting is feasible only between the flat copper surface and the printed circuit board (PCB) pad, resulting in limited solder volume and difficulty to ascertain the successful soldering of the package onto the PCB by the visual inspection in the absence of solder fillets.

To address this issue, wettable flank (WF) technology has been introduced. This technology enhances the inspectability of solder joints by promoting the formation of solder fillets. However, the existing step-cut and dimple-pad configurations for wettable flanks face challenges in achieving both the desired wetting height and maintaining structural reliability.

SUMMARY OF THE INVENTION

An objective of the present invention is to provide an innovative terminal structure with multi-level staggered configuration to enable the desired wetting height for robust AOI (automatic optical inspection) and ensure the reliability of the overall structure.

In accordance with the foregoing and other objectives, the present invention provides a terminal structure that includes an electrically conductive post, an electrically conductive flange, and a stress buffer. Also, the present invention provides an interconnect substrate that includes a base and a plurality of the above terminal structures. The electrically conductive post has a top surface, a bottom surface at a first level, and an upper sidewall and a lower sidewall extending between the top surface and the bottom surface thereof and respectively adjacent to the top surface and the bottom surface thereof. The base is spaced from the electrically conductive post and has a top side for attachment of a semiconductor device, a bottom side at the first level, and an upper sidewall and a lower sidewall extending between the top side and the bottom side thereof and respectively adjacent to the top side and the bottom side thereof. The stress buffer laterally covers and surrounds the upper sidewall of the electrically conductive post as well as the upper sidewall of the base if present, and has a bottom surface at a second level between the top surface and the bottom surface of the electrically conductive post. The electrically conductive flange extends laterally from the upper sidewall of the electrically conductive post to an outer peripheral edge thereof substantially flush with an outer periphery of the stress buffer, and has a depression surface at a third level between the top surface and the bottom surface of the electrically conductive post to define a depression region therebelow. Further, a solderable layer can be deposited on the depression surface of the electrically conductive flange, the bottom surface of the electrically conductive post, and a lateral surface of the electrically conductive post to form a stepped pad with a wettable depression region.

Accordingly, the present invention can provide a semiconductor package configured with wettable depression regions at its periphery. In the semiconductor package, a semiconductor device can be disposed over the base and electrically connected to the electrically conductive posts, and a stiffener is used to encapsulate the semiconductor device. When the semiconductor package is electrically coupled to a wiring board through a plurality of solder bumps disposed between and coupled to the stepped pads of the terminal structures and the contact pads of the wiring board, the solder bumps can contact the solderable layer and laterally cover and surround the lower sidewalls of the electrically conductive posts, fills up the wettable depression regions and extend laterally beyond the periphery of the semiconductor package, resulting in formation of solder fillets.

By the above-mentioned multi-level staggered configuration, the terminal structure offers advantages in achieving the desired wetting height, leading to improved inspectability of solder joints. Additionally, the easy control of height differences between the first and second levels and between the first and third levels contributes to ensuring both primary and secondary board-level reliability.

These and other features and advantages of the present invention will be further described and more readily apparent from the detailed description of the preferred embodiments which follows.

BRIEF DESCRIPTION OF THE DRAWINGS

The detailed description of the preferred embodiments of the present invention can best be understood when read in conjunction with the following drawings, in which.

DETAILED DESCRIPTION OF THE PREFERRED EMBODIMENTS

Hereafter, examples will be provided to illustrate the embodiments of the present invention. The advantages and effects of the invention will become more apparent from the following description of the present invention. It should be noted that the accompanying figures are simplified and illustrative. The quantity, shape and size of components shown in the figures may be modified according to practical conditions, and the arrangement of components may be more complex. Other various aspects may also be practiced or applied in the invention, and various modifications and variations can be made without departing from the spirit of the invention based on various concepts and applications.

Embodiment 1

FIGS. 1-16 are schematic views showing a method of making a semiconductor package that includes an interconnect substrate, a semiconductor device and a stiffener in accordance with the first embodiment of the present invention.

Figure 1:
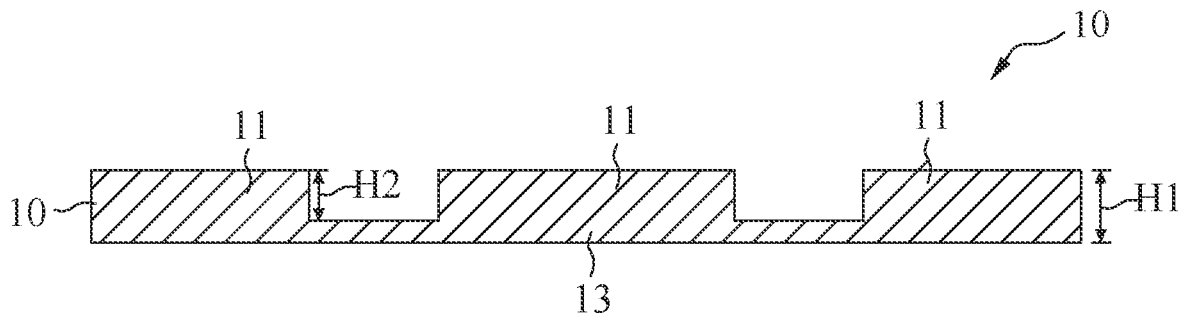
FIGS. 1 and 2 are cross-sectional and top perspective views, respectively, of an electrically conductive plate in accordance with the first embodiment of the present invention.
Figure 2:
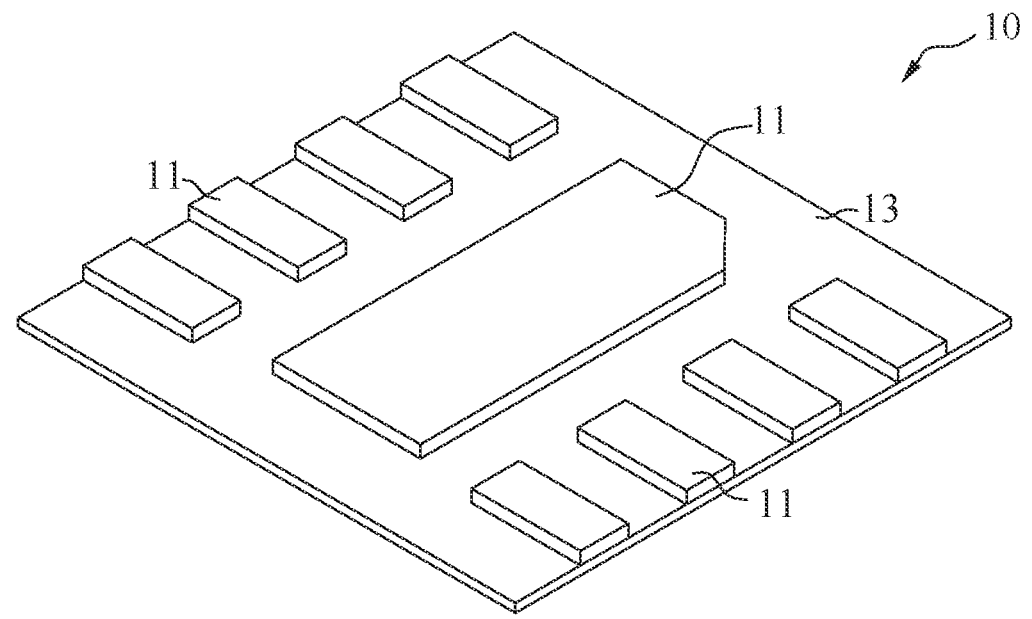

FIGS. 1 and 2 are cross-sectional and top perspective views, respectively, of an electrically conductive plate 10. The electrically conductive plate 10 has a thickness H1 and typically is made of copper, aluminum, alloy 42, iron, nickel, silver, gold, combinations thereof, alloys thereof or any other suitable metals. In this embodiment, the electrically conductive plate 10 is made of copper and formed with an array of protrusions 11 projecting from the supporting carrier 13 by, for example, one-sided etching. The protrusions 11 contacts and project from a top side of the supporting carrier 13 and have a predetermined projecting height H2. Preferably, the thickness H1 of the electrically conductive plate 10 ranges from 150 micrometers to 300 micrometers, and the projecting height H2 of the protrusions 11 has a maximum of H1—25 micrometers.

Figure 3:
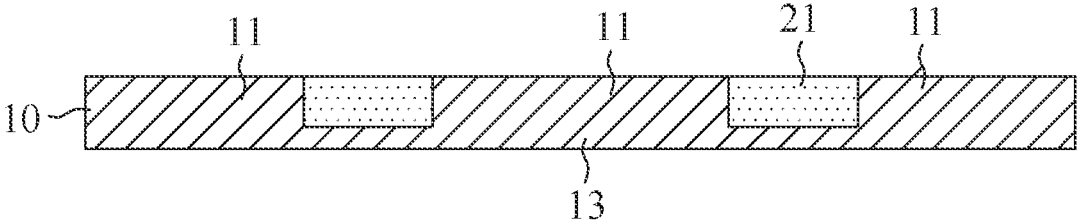
FIGS. 3 and 4 are cross-sectional and top perspective views, respectively, of the structure of FIGS. 1 and 2 further provided with a stress buffer in accordance with the first embodiment of the present invention.
Figure 4:
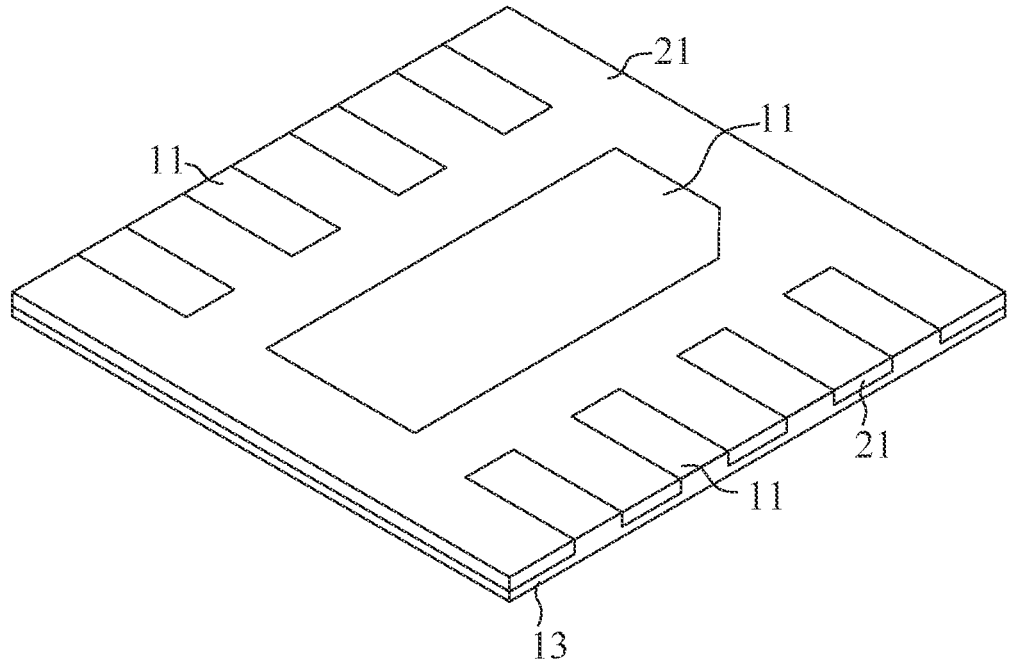

FIGS. 3 and 4 are cross-sectional and top perspective views, respectively, of the structure provided with a stress buffer 21. The stress buffer 21 can be dispensed on the supporting carrier 13 and fill spaces between the protrusions 11. As a result, the stress buffer 21 laterally covers and surrounds and conformally coats sidewalls of the protrusions 11 and extends laterally to outer peripheral edges of the electrically conductive plate 10. By planarization, the stress buffer 21 can have an exposed top surface substantially coplanar with the top surface of the protrusions 11. In this embodiment, the stress buffer 21 typically is made of an electrically insulative material (such as a resin material) and preferably has an elastic modulus lower than 10 Gpa so as to absorb stress and alleviate warpage of the electrically conductive plate 10.

Figure 5:
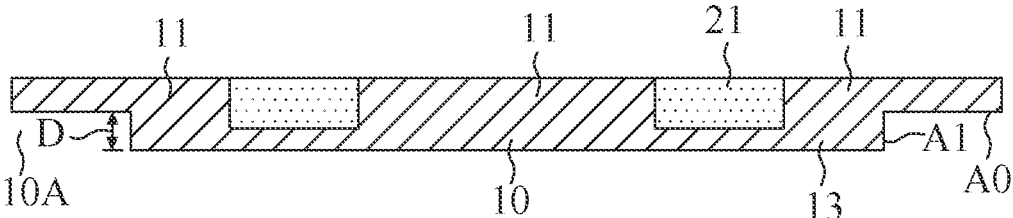
FIGS. 5, 6 and 7 are cross-sectional, top and bottom perspective views, respectively, of the structure of FIGS. 3 and 4 further formed with depression regions in accordance with the first embodiment of the present invention.
Figure 6:
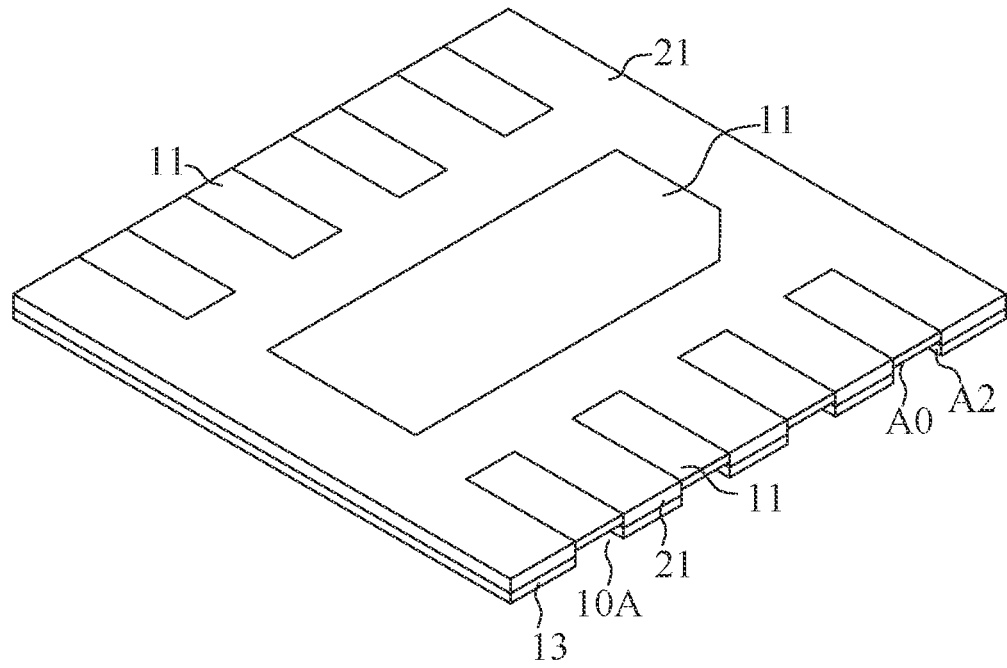
Figure 7:
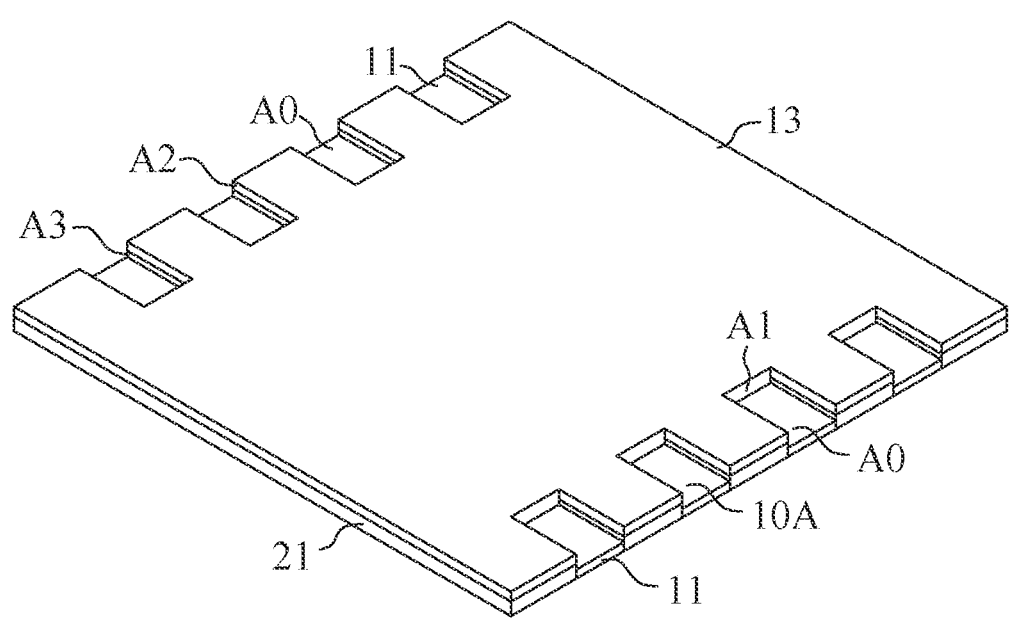

FIGS. 5, 6 and 7 are cross-sectional, top and bottom perspective views, respectively, of the structure formed with an array of depression regions 10A adjacent to the outer peripheral edges of the electrically conductive plate 10 and aligned with the protrusions 11. The depression regions 10A can be formed by, for example, one-sided etching from the bottom side of the supporting carrier 13, and each an open lateral end at a respective one of the outer peripheral edges of the electrically conductive plate 10. In this embodiment, the depth D of the depression regions 10A is greater than the thickness of the supporting carrier 13 (i.e. the distance between the bottom surface of the stress buffer 21 and the bottom side of the supporting carrier 13). As a result, each of the depression regions 10A is defined by a depression surface A0 of the electrically conductive plate 10, a first inner lateral surface A1 and two opposite second inner lateral surfaces A2 of the electrically conductive plate 10 and two opposite third inner lateral surfaces A3 of the stress buffer 21. The first inner lateral surface A1 faces the open lateral end of the depression region 10A and is adjacent to and substantially orthogonal to the depression surface A0 and the two opposite second inner lateral surfaces A2 as well as the two opposite third inner lateral surfaces A3. The two opposite second inner lateral surfaces A2 are substantially coplanar with the two opposite third inner lateral surfaces A3, respectively, and spaced from the depression surface A0 by the two opposite third inner lateral surfaces A3. Preferably, the depth D of the depression regions 10A ranges from 50 micrometers to 125 μm to subsequently enable a desired wetting height for visual inspection. In this embodiment, the two opposite third inner lateral surfaces A3 of the stress buffer 21 can serve as etch stop surfaces and are exposed from the depression region 10A.

Figure 8:
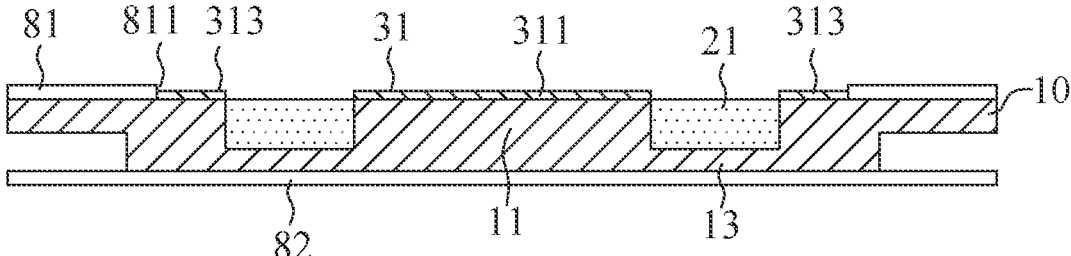
FIG. 8 is a cross-sectional view of the structure of FIG. 5 further provided with a top resist layer, a bottom resist layer and a top plated layer in accordance with the first embodiment of the present invention.

FIG. 8 is a cross-sectional view of the structure provided with a top resist layer 81, a bottom resist layer 82 and a top plated layer 31. The top resist layer 81 partially covers the top surfaces of the electrically conductive plate 10 and the stress buffer 21, and includes an opening 811 to expose selected portions of the electrically conductive plate 10 and the stress buffer 21 from above. The bottom resist layer 82 completely covers the bottom surface of the electrically conductive plate 10. After deposition of the top resist layer 81 and the bottom resist layer 82, the top plated layer 31 is deposited on the exposed top surface of the electrically conductive plate 10 by, for example, electroless plating followed by electroplating, to define a thermal pad 311 and an array of bonding pads 313. The top plated layer 31 may be made of gold, nickel, palladium or a combination thereof, or any bondable metal. In this embodiment, the top plated layer 31 is a Ni/Au layer.

Figure 9:
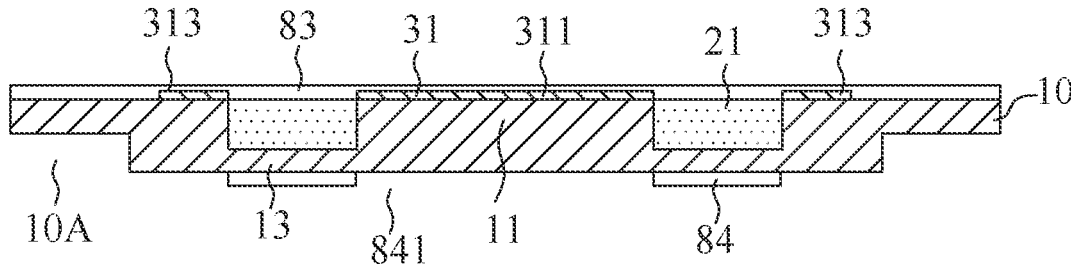
FIGS. 9 and 10 are cross-sectional and bottom perspective views, respectively, of the structure of FIG. 8 further subjected to removal of the top resist layer and the bottom resist layer and then provided with another top resist layer and another bottom resist layer after in accordance with the first embodiment of the present invention.
Figure 10:
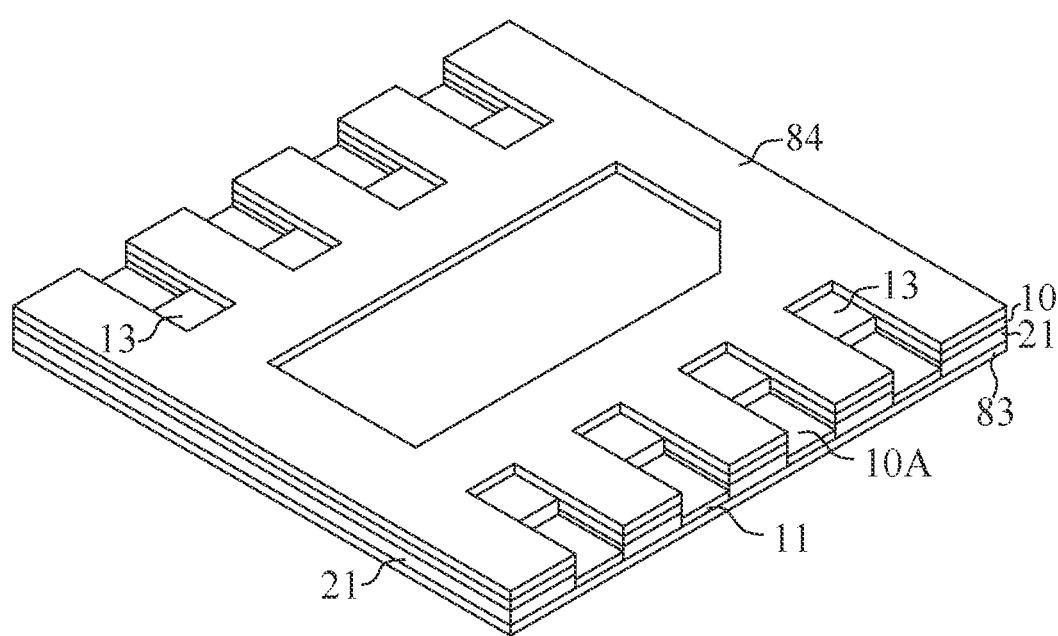

FIGS. 9 and 10 are cross-sectional and bottom perspective views, respectively, of the structure after the removal of the top resist layer 81 and the bottom resist layer 82 followed by the deposition of another top resist layer 83 and another bottom resist layer 84. The top resist layer 83 completely covers the top surfaces of the electrically conductive plate 10, the stress buffer 21 and the top plated layer 31. The bottom resist layer 84 partially covers the electrically conductive plate 10 from below, and includes openings 841 to expose selected portions of the supporting carrier 13 and the depression regions 10A from below.

Figure 11:
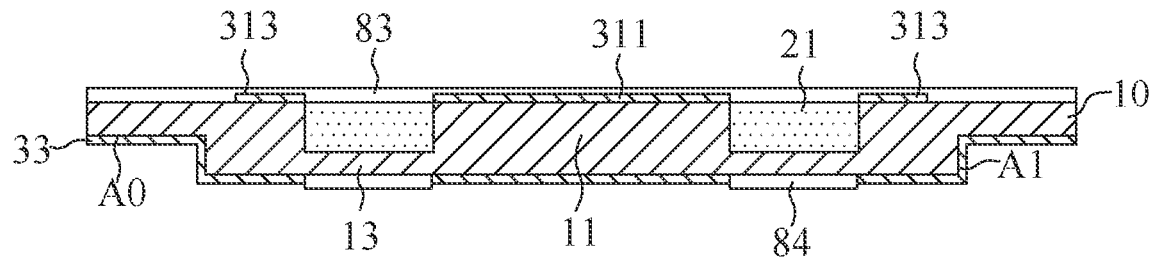
FIG. 11 is a cross-sectional view of the structure of FIGS. 9 and 10 further provided with a bottom plated layer in accordance with the first embodiment of the present invention.

FIG. 11 is a cross-sectional view of the structure provided with a bottom plated layer 33. The bottom plated layer 33 is deposited on the exposed portions of the supporting carrier 13 as well as the depression surfaces A0, the first inner lateral surface A1 and the second inner lateral surfaces A2 by, for example, electroless plating followed by electroplating. In this embodiment, the bottom plated layer 33 may be a silver layer and can serve as an etching mask for subsequent patterning process.

Figure 12:
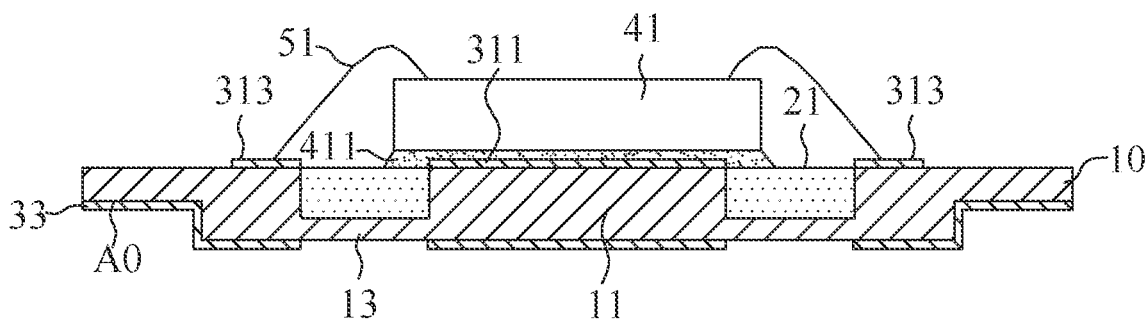
FIGS. 12 and 13 are cross-sectional and top plan views, respectively, of the structure of FIG. 11 further subjected to removal of the top resist layer and the bottom resist layer and then provided with a semiconductor device in accordance with the first embodiment of the present invention.
Figure 13:
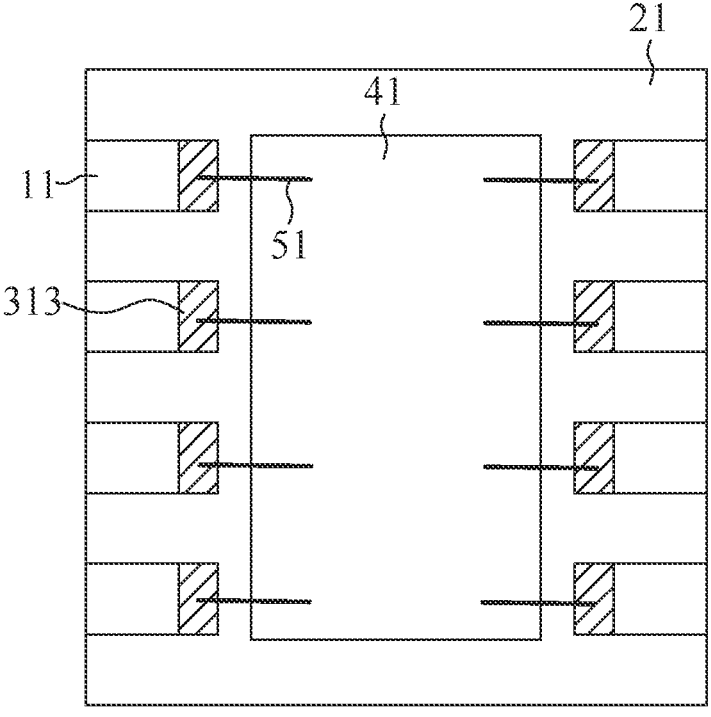

FIGS. 12 and 13 are cross-sectional and top plan views, respectively, of the structure after the removal of the top resist layer 83 and the bottom resist layer 84 followed by device attachment. A semiconductor device 41, illustrated as a chip, is mounted and superimposed over the thermal pad 311 using a thermal adhesive 411 and electrically coupled to the bonding pads 313 using bonding wires 51.

Figure 14:
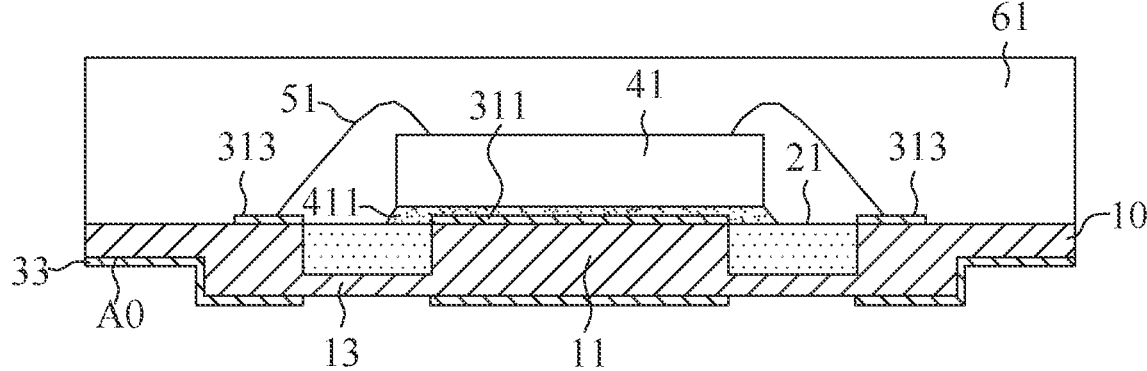
FIG. 14 is a cross-sectional view of the structure of FIG. 12 further provided with a stiffener in accordance with the first embodiment of the present invention.

FIG. 14 is a cross-sectional view of the structure provided with a stiffener 61. The stiffener 61 encapsulates the semiconductor device 41 and the bonding wires 51 and covers the top surfaces of the electrically conductive plate 10 and the stress buffer 21 as well as the bonding pads 313 and extends laterally to the outer peripheral edges of the electrically conductive plate 10. The stiffener 61 typically has an elastic modulus higher than that of the stress buffer 21 to provide sufficient strength and control the overall flatness of this structure.

Figure 15:
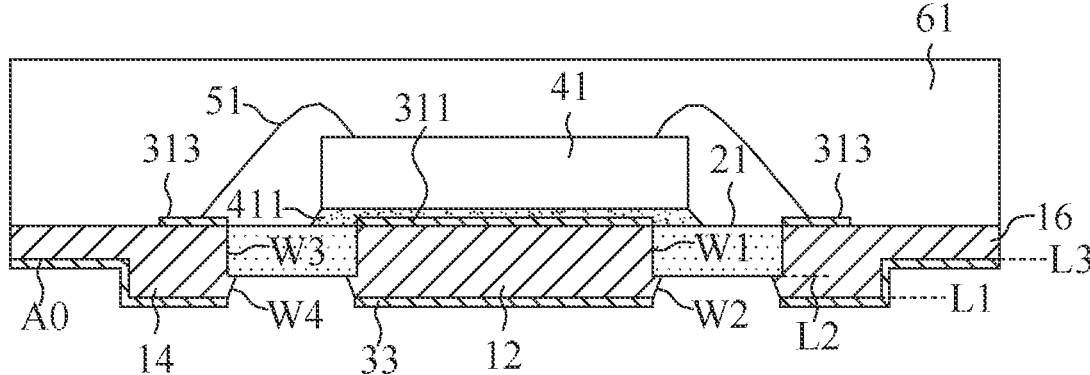
FIG. 15 is a cross-sectional view of the structure of FIG. 14 further formed with a base, electrically conductive posts and electrically conductive flanges in accordance with the first embodiment of the present invention.

FIG. 15 is a cross-sectional view of the structure formed with a base 12, electrically conductive posts 14 spaced from the base 12 and electrically conductive flanges 16 adjacent to the electrically conductive posts 14. The supporting carrier 13 is patterned by removing the exposed region not covered by the bottom plated layer 33 to define the base 12, the electrically conductive posts 14, and the electrically conductive flanges 16 with the depression surface A0 between the top and bottom surfaces of the electrically conductive posts 14. Optionally, after the patterning, the bottom plated layer 33 as the etching mask may be removed.

The base 12 has a top side for attachment of the semiconductor device 41 thereon, a bottom side at the first level L1, and an upper sidewall W1 and a lower sidewall W2 extending between the top side and the bottom side and respectively adjacent to the top side and the bottom side. In this embodiment, the base 12 has a lower portion that is not covered by the stress buffer 21 and further extends laterally underneath the stress buffer 21. Additionally, as the patterning is performed by one-sided etching from the bottom side of the supporting carrier 13, the lower sidewall W2 of the base 12 may be inwardly tapered sidewalls not covered by the stress buffer 21 and extending from the stress buffer 21 to the first level L1

The electrically conductive posts 14 are spaced from each other and the base 12 by the stress buffer 21 and each has a top surface substantially coplanar with the top side of the base 12, a bottom surface at the first level L1, and an upper sidewall W3 and a lower sidewall W4 extending between the top surface and the bottom surface and respectively adjacent to the top surface and the bottom surface. In this embodiment, each of the electrically conductive posts 14 has a lower portion that is not covered by the stress buffer 21 and further extends laterally underneath the stress buffer 21. Additionally, as the patterning is performed by one-sided etching from the bottom side of the supporting carrier 13, the lower sidewalls W4 of the electrically conductive posts 14 may be inwardly tapered sidewalls not covered by the stress buffer 21 and extending from the stress buffer 21 to the first level L1.

The stress buffer 21 laterally covers and surrounds the upper sidewall W1 of the base 12 and the upper sidewalls W3 of the electrically conductive posts 14 as well as two opposite lateral edges of each the electrically conductive flanges 16, and has a top surface substantially coplanar with the top surface of the electrically conductive posts 14 and an exposed bottom surface at the second level L2 between the top and bottom surfaces of the electrically conductive posts 14 and between the top and bottom sides of the base 12. In this embodiment, the height difference between the second level L2 and the top surface of the electrically conductive post 14 maybe 25 micrometers or more.

Each of the electrically conductive flanges 16 is integrated with a respective one of the electrically conductive posts 14 and extends laterally from the upper sidewall W3 of the respective electrically conductive post 14 to the periphery of the stiffener 61, and has a top surface substantially coplanar with the top surface of the electrically conductive post 14 and the depression surface A0 at the third level L3 between the top surface and the bottom surface of the electrically conductive post 14. In this embodiment, the second level L2 lies between the first level L1 and the third level L3, and the height difference between the first level L1 and the third level L3 preferably is 50 micrometers or more.

Figure 16:
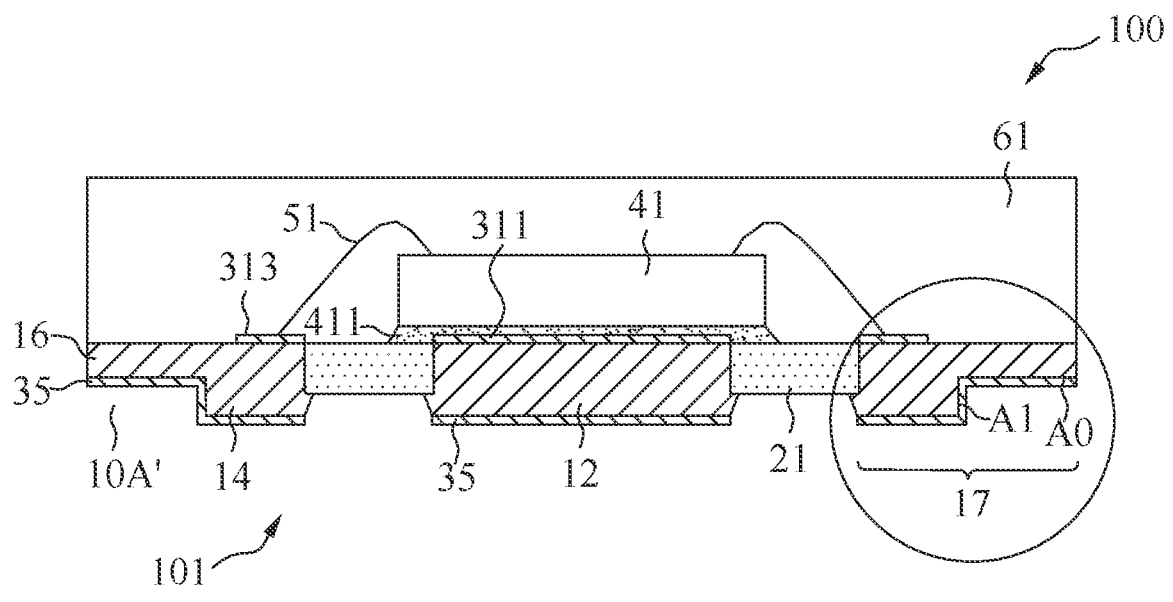
FIG. 16 is a cross-sectional view of the structure of FIG. 15 further subjected to removal of the bottom plated layer and then provided with a solderable layer to finish the fabrication of a semiconductor package in accordance with the first embodiment of the present invention.

FIG. 16 is a cross-sectional view of the structure after the removal of the bottom plated layer 33 followed by the deposition of a solderable layer 35. The solderable layer 35 conformally covers the bottom surfaces of the electrically conductive posts 14, the depression surfaces A0 of the electrically conductive flanges 16, and the lateral surfaces of the electrically conductive posts 14 (identical to the first inner lateral surfaces A1 of electrically conductive plate 10 discussed earlier), resulting in the formation of stepped pads 17 each with a wettable depression region 10A'. Also, the solderable layer 35 conformally covers the bottom side of the base 12. Since the bottom plated layer 33 shown in FIG. 15 may be made of a solderable material, this step of replacing the bottom plated layer 33 with the solderable layer 35 can be omitted and the bottom plated layer 33 is considered as a solderable layer.

At this stage, a semiconductor package 100 is accomplished and includes the interconnect substrate 101, the semiconductor device 41 electrically connected to the interconnect substrate 101 via the bonding wires 51, and the stiffener 61 encapsulating the semiconductor device 41. In this embodiment, the interconnect substrate 101 includes the base 12, the electrically conductive posts 14, the electrically conductive flanges 16, the stress buffer 21, the thermal pad 311, the bonding pads 313 and the solderable layer 35.

Figure 17:
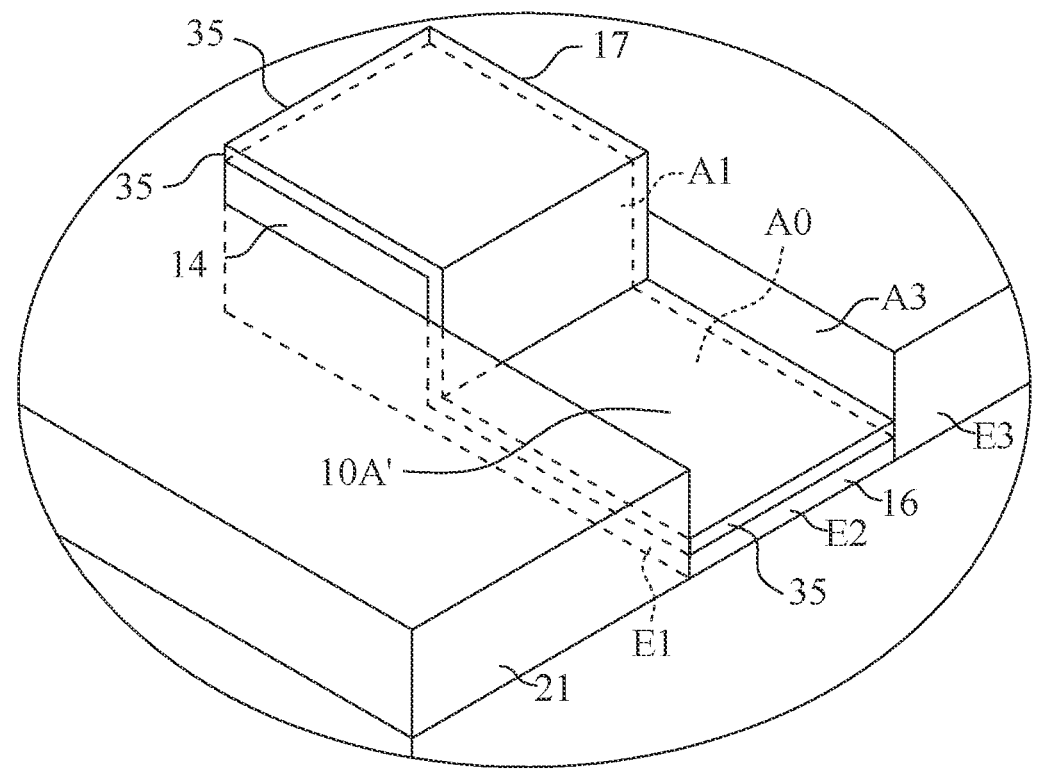
FIG. 17 is an enlarged bottom perspective view of a circled portion in FIG. 16 in accordance with the first embodiment of the present invention.

FIG. 17 is an enlarged bottom perspective view of a circled portion in FIG. 16 for detailed illustration of the terminal structure included in the interconnect substrate 101 of the semiconductor package 100. The terminal structure mainly includes the electrically conductive post 14, the electrically conductive flange 16 and the stress buffer 21. In this embodiment, the electrically conductive flange 16 has two opposite lateral edges E1 completely covered by the stress buffer 21 and an outer peripheral edge E2 substantially flush with an outer periphery E3 of the stress buffer 21. Additionally, the terminal structure typically further includes the solderable layer 35 that conformally covers the bottom surface and the lateral surface of the electrically conductive post 14 and the depression surface A0 of the electrically conductive flange 16. Accordingly, the terminal structure is configured with a stepped pad 17, which defines a wettable depression region 10A' at the periphery of the semiconductor package 100 and facilitates the formation of solder fillets to improve the inspectability of the solder joints. In this embodiment, as the second level L2 lies between the first level L1 and the third level L3, the third inner lateral surfaces A3 of the stress buffer 21 are exposed from the wettable depression region 10A'.

Figure 18:
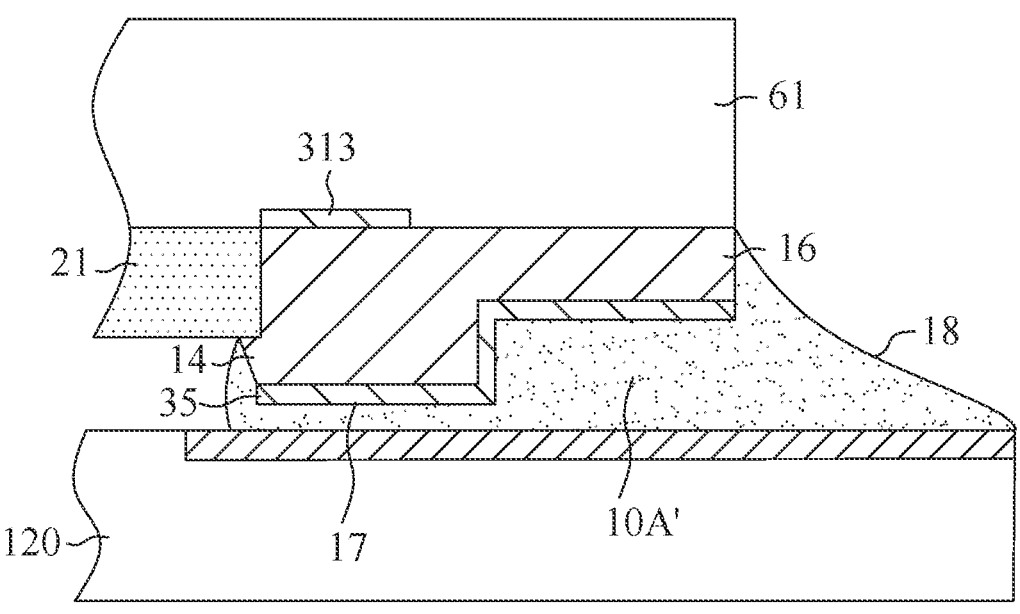
FIG. 18 is a cross-sectional view that illustrates the solder wetting of a multi-level staggered terminal structure with a solder material in accordance with the first embodiment of the present invention.

FIG. 18 is a cross-sectional view that illustrates the solder wetting of a multi-level staggered terminal structure with a solder material 18. As seen, the solder material 18 contacts the solderable layer 35 at the stepped pad 17, laterally covers and surrounds the lower sidewall of the electrically conductive post 14, fills up the wettable depression regions 10A' and extends laterally beyond the outer side of the electrically conductive flange 16, resulting in formation of a solder fillet. By the sufficient depth of the wettable depression region 10A', the desired wetting height can be achieved to facilitate the formation of solder fillets at the mounting edge and thus enables visual inspections and testing to validate the integrity of the connection on the printed circuit board 120.

Figure 19:
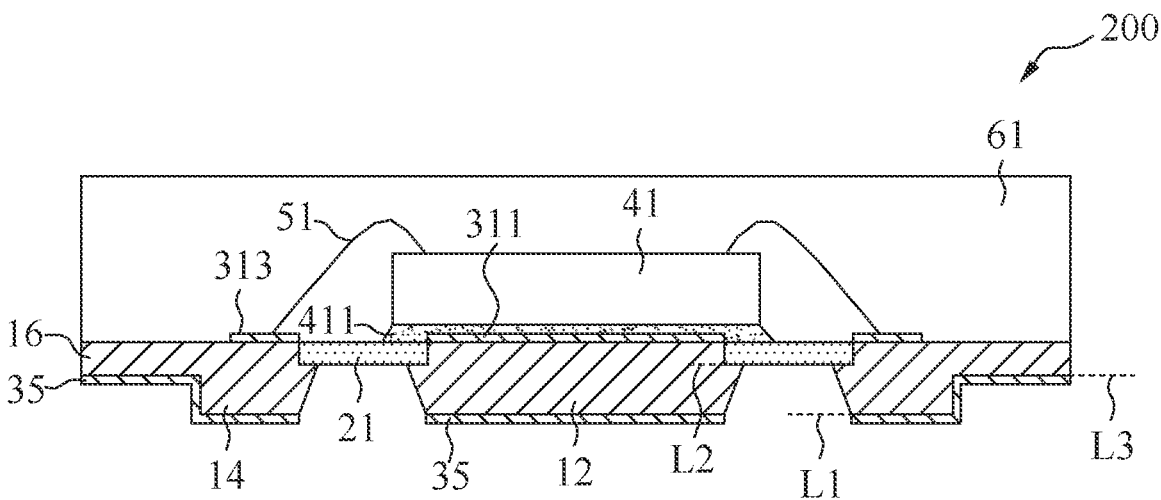
FIGS. 19 and 20 are a cross-sectional view of another aspect of the semiconductor package and an enlarged bottom perspective view of a terminal structure thereof, respectively, in accordance with the first embodiment of the present invention.
Figures 20, 21:
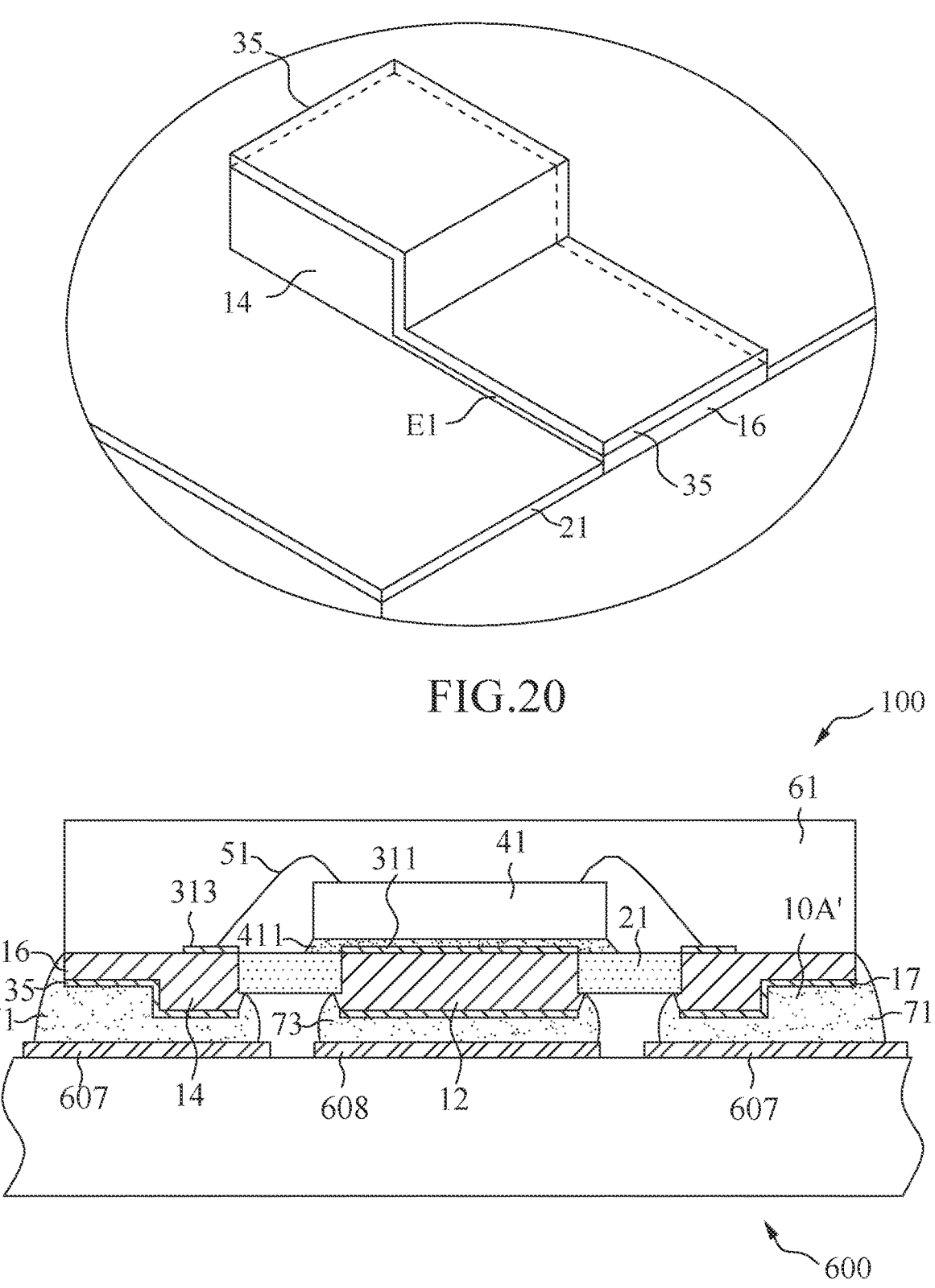
FIG. 21 is a cross-sectional view of a semiconductor assembly in accordance with the first embodiment of the present invention.

FIGS. 19 and 20 are a cross-sectional view of another aspect of the semiconductor package and an enlarged bottom perspective view of a terminal structure thereof, respectively, in accordance with the first embodiment of the present invention. The semiconductor package 200 is similar to that illustrated in FIG. 16, except that the third level L3 lies between the first level L1 and the second level L2. Accordingly, as shown in FIG. 20, the electrically conductive flange 16 has two opposite lateral edges E1 extending beyond the stress buffer 21 in a direction towards the solderable layer 35 and thus having selected portions not covered by the stress buffer 21.

FIG. 21 is a cross-sectional view of a semiconductor assembly with the semiconductor package 100 of FIG. 16 superimposed over and soldered to a wiring board 600. The stepped pads 17 of the semiconductor package 100 are electrically connected to first contact pads 607 of the wiring board 600 using first solder bumps 71, while the base 12 is thermally conductible to a second contact pad 608 of the wiring board 600 using a second solder bump 73.

The solder bumps 71 contacts the first contact pads 607 of the wiring board 600 and the solderable layer 35 at the stepped pads 17 of the semiconductor package 100 and laterally cover and surround the lower sidewalls of the electrically conductive posts 14, fills up the wettable depression regions 10A' and extend laterally beyond the periphery of the semiconductor package 100 to provide electrical connection between the semiconductor package 100 and the wiring board 600. Similarly, the second solder bump 73 contacts the second contact pad 608 of the wiring board 600 and the solderable layer 35 at the base 12 of the semiconductor package 100 and laterally covers and surrounds the lower sidewall of the base 12 to provide thermal conduction between the semiconductor package 100 and the wiring board 600.

Embodiment 2

Figure 22:
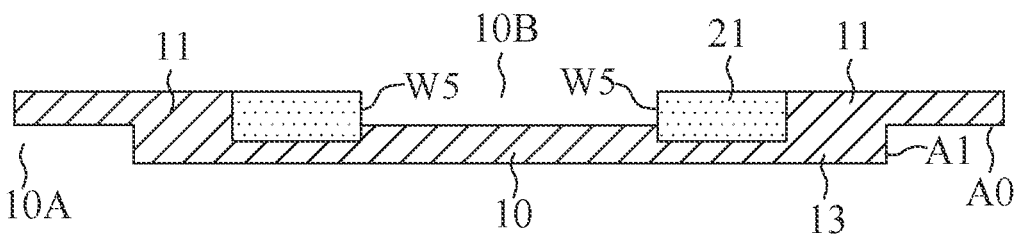
FIGS. 22 and 23 are cross-sectional and top perspective views, respectively, of the structure subjected to the execution of multiple steps as illustrated in FIGS. 1-4 and then formed with depression regions and a cavity in accordance with the second embodiment of the present invention.
Figure 23:
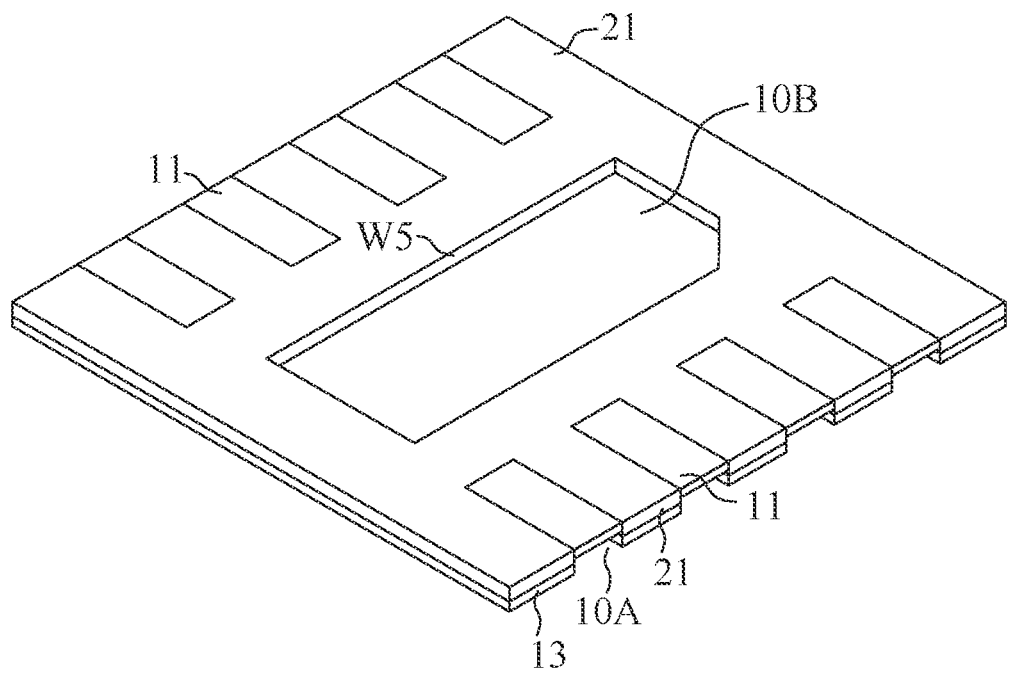
Figure 24:
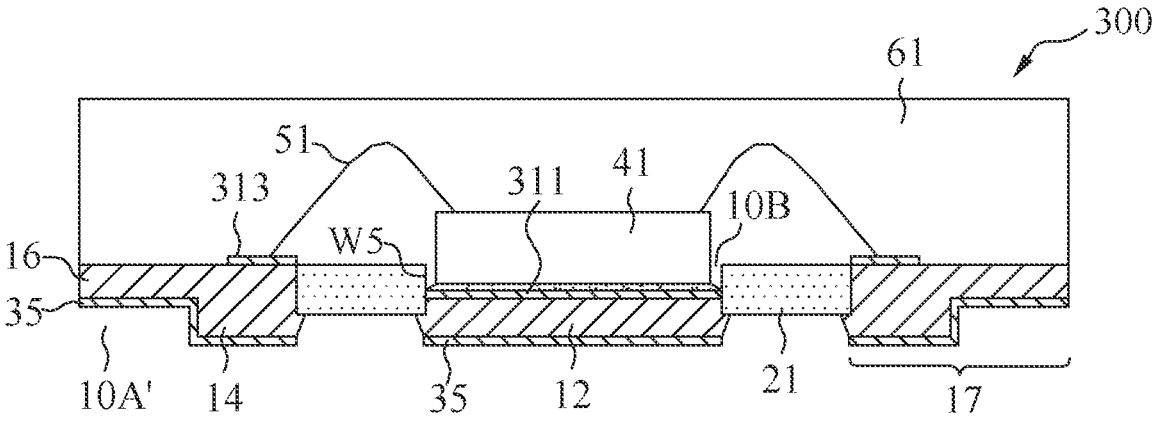
FIG. 24 is a cross-sectional view of the structure of FIG. 22 further subjected to execution of multiple steps as illustrated in FIGS. 8-16 in accordance with the second embodiment of the present invention.

FIGS. 22-24 are schematic views showing a method of making a semiconductor package in accordance with the second embodiment of the present invention. For purposes of brevity, any description in above Embodiment 1 is incorporated herein insofar as the same is applicable, and the same description need not be repeated.

FIGS. 22 and 23 are cross-sectional and top perspective views, respectively, of the structure after protrusion formation and then stress buffer dispensation as illustrated in FIGS. 1-4, followed by the formation of depression regions 10A and a cavity 10B. For formation of the depression regions 10A and the cavity 10B, selected portions of the electrically conductive plate 10 are removed from bottom and above, respectively, to form the depression regions 10A adjacent to the peripheral edges of the electrically conductive plate 10 and the cavity 10B for device placement. In this illustration, the depth of the cavity 10B is less than the thickness of the stress buffer 21. As a result, the stress buffer 21 has an inner surrounding sidewall W5 exposed from the cavity 10B.

FIG. 24 is a cross-sectional view of the structure after execution of multiple steps as illustrated in FIGS. 8-16. Accordingly, a semiconductor package 300 is accomplished, which is similar to that illustrated in FIG. 16, except that the semiconductor device 41 is placed in the cavity 10B defined by the inner surrounding sidewall W5 of the stress buffer 21 and the top side of the base 12 and attached on the thermal pad 311, and the stiffener 61 further fills up remaining spaces within the cavity 10B.

The terminal structures, interconnect substrates, semiconductor packages and assemblies described above are merely exemplary. Numerous other embodiments are contemplated. In addition, the embodiments described above can be mixed-and-matched with one another and with other embodiments depending on design and reliability considerations. The semiconductor device can share or not share the base with other semiconductor devices. For instance, a base can accommodate a single semiconductor device, and the interconnect substrate can include multiple bases arranged in an array for multiple chips. Alternatively, numerous semiconductor devices can be mounted over a single base. Also, the wiring board can include additional contact pads to receive additional bases of the interconnect substrate.

As illustrated in the aforementioned embodiments, a distinctive multi-level staggered terminal structure of an interconnect substrate is configured to enable the desired wetting height for robust visual inspection and to ensure primary and secondary board-level reliability. The multi-level staggered terminal structure mainly includes an electrically conductive post, an electrically conductive flange, and a stress buffer, in which (i) the electrically conductive post has a bottom surface at a first level, (ii) the stress buffer has a bottom surface at second level, and (iii) the electrically conductive flange has a depression surface at a third level. The first, second and third levels are horizontal reference lines parallel to one another, and the third level could be either more distant from the first level than the second level is or nearer to the first level than the second level is. Accordingly, the terminal structure can enhance primary board-level reliability by controlling the height difference between the first level and the second level within a desirable range and also improve second board-level reliability by control of the height difference between the first level and the third level within a desirable range. In a preferred embodiment, the height difference between the first level and the second level is 25 micrometers or more, while the height difference between the first level and the third level is 50 micrometers or more. Additionally, the height difference between the second level and the top surface of the electrically conductive post may be 25 micrometers or more.

The interconnect substrate may further include a base in addition to a plurality of the above-mentioned terminal structures. Accordingly, in a preferred embodiment, the interconnect substrate with the terminal structures include a base, a plurality of electrically conductive posts, a plurality of electrically conductive flanges and a stress buffer. The terminal structure and the interconnect substrate typically further include a solderable layer, and the interconnect substrate may optionally further include a bonding pad on a top surface of the electrically conductive post and a thermal pad on a top side of the base. The present invention also provides a semiconductor package, in which a semiconductor device is electrically coupled to the above-mentioned interconnect substrate and encapsulated by a stiffener. Additionally, the semiconductor package can be further electrically coupled to a wiring board to finalize a semiconductor assembly.

The electrically conductive post and the base can be formed by two steps of one-sided etching from opposite directions. As a result, each of the electrically conductive post and the base may have an upper portion with an inwardly tapered sidewall extending from the second level to the top surface thereof and covered by the stress buffer and a lower portion with an inwardly tapered sidewall extending from the second level to the first level. The top and bottom sides of the base may be substantially coplanar with the top and bottom surfaces of the electrically conductive post, respectively. Alternatively, in the example of a cavity being formed and aligned with the base, the top side of the base is lower than the top surface of the electrically conductive post and preferably is located between the top surface and the bottom surface of the stress buffer, and the cavity is defined by an inner surrounding sidewall of the stress buffer and the top side of the base. Additionally, the lower portions of the electrically conductive post and the base not covered by the stress buffer preferably further extend laterally underneath the bottom surface of the stress buffer.

The stress buffer laterally covers and surrounds and conformally coats the upper sidewall of the electrically conductive post and lateral edges of the electrically conductive flange as well as the upper sidewall of the base if present, and has an outer periphery which can be flush with an outer peripheral edge of the electrically conductive flange. Preferably, the stress buffer has an elastic modulus of lower than 10 Gpa to absorb the stress and alleviate the warpage of the structure. Thereof, the elastic modulus of the stress buffer typically is lower than that of the stiffener. In the example of the second level being between the first level and the third level, the stress buffer has inner lateral surfaces (e.g., two opposite inner lateral surfaces) that extend from the third level to the second level and are adjacent to and orthogonal or angled to (typically substantially orthogonal to) the depression surface of the electrically conductive flange and define lateral boundaries of a depression region below the depression surface. By planarization, the top surface of the stress buffer can be substantially coplanar with the top surfaces of the electrically conductive flange and the electrically conductive post. Also, the top surface of the stress buffer may be substantially coplanar with the top side of the base, or the stress buffer may extend beyond the top side of the base and thus have an inner surrounding sidewall that defines the boundaries of the cavity above the top side of the base.

The electrically conductive flange extends laterally from the upper sidewall of the electrically conductive post to a periphery of the interconnect substrate and defines the depression region with an open lateral end at the periphery of the interconnect substrate. As such, the electrically conductive post has a lateral surface not covered by the stress buffer and opposite to the open lateral end of the depression region and adjacent to and orthogonal or angled to (typically substantially orthogonal to) the depression surface of the electrically conductive flange and extending from the depression surface to the bottom surface of the electrically conductive post. Also, the lateral surface of the electrically conductive post may be adjacent to and orthogonal or angled to the inner lateral surfaces of the stress buffer in the example of the second level being between the first level and the third level. In a preferred embodiment, the depression region of the electrically conductive flange is formed by one-sided etching, and thus the lateral surface of the electrically conductive post facing towards the depression region may be an inwardly tapered surface extending from the depression surface at the third level to the bottom surface thereof at the first level. The depression surface of the electrically conductive flange is located between the top surface and the bottom surface of the electrically conductive post, and is not covered by the stress buffer or any electrically insulative material. In the example of the second level being between the first level and the third level, the depression region is defined by the depression surface of the electrically conductive flange, the lateral surface of the electrically conductive post and the inner lateral surfaces (e.g. two opposite inner lateral surfaces) of the stress buffer, and the lateral edges of the electrically conductive flange are completely covered by the stress buffer. Additionally, since the side profile of the electrically conductive flange may be defined simultaneously with side profiles of the upper portions of the electrically conductive post and the base if present, the lateral edges of the electrically conductive flange completely covered by the stress buffer may be inwardly tapered edges extending from the third level to the top surface of the electrically conductive flange and have the same degree of inclination as those of the upper portions of the electrically conductive post and the base if present. As for the alternative example of the third level being between the first level and the second level, the lateral edges of the electrically conductive flange extend beyond the bottom surface of the stress buffer from the top surface of the electrically conductive flange, and thus the electrically conductive flange has an upper portion completely covered by the stress buffer in a lateral direction and a lower portion not covered by the stress buffer. Since the side profile of the lower portion of the electrically conductive flange may be defined simultaneously with side profiles of the lower portions of the electrically conductive post and the base if present, the lower portion of the electrically conductive flange may be inwardly tapered as it extends from the second level to the third level, and this tapering may be at the same degree of inclination as that found in the lower portions of the electrically conductive post and the base if present.

The solderable layer can conformally cover the depression surface of the electrically conductive flange, the bottom surface of the electrically conductive post, and the lateral surface of the electrically conductive post to form a stepped pad with a wettable depression region at the periphery of the interconnect substrate, resulting in wettable-flank feature. The material of the solderable layer may be any material for the promotion of solder wetting to enable reliable connections and the formation of a fillet that can be detected post-SMT PCB processing using automated optical inspection (AOI) equipment.

The stiffener typically has a higher elastic modulus than that of the stress buffer to provide sufficient strength and control the overall flatness of this structure. In a preferred embodiment, the stiffener encapsulates the semiconductor device and covers the top surfaces of the electrically conductive posts, the electrically conductive flanges and the stress buffer and extends laterally to the periphery of the semiconductor package.

The semiconductor device may be a packaged or unpackaged chip (e.g. a packaged or unpackaged power chip) and electrically coupled to the electrically conductive posts. In a preferred embodiment, the semiconductor device is superimposed and mounted over the base and wire bonded to the electrically conductive posts. In a specific implementation, the semiconductor device is attached to the thermal pad on the top side of the base using a thermal adhesive and electrically connected to the electrically conductive posts using bonding wires in contact with the semiconductor device and the bonding pads on the top surface of the electrically conductive posts. For the example of a cavity being present at the top side of the base, the semiconductor device is located within the cavity and laterally surrounded by the inner surrounding sidewall of the stress buffer.

The semiconductor package including a plurality of the above-mentioned terminal structures can be superimposed over and electrically connected to a wiring board through a plurality of solder bumps disposed between and coupled to the stepped pads of the terminal structures of the semiconductor package and contact pads of the wiring board. The solder bumps contact the solderable layer and laterally cover and surround the lower sidewalls of the electrically conductive posts, fills up the wettable depression regions and extend laterally beyond the periphery of the semiconductor package. In a preferred embodiment, the wiring board includes a plurality of first contact pads and a second contact pad, and the semiconductor package is soldered to the wiring board through a plurality of first solder bumps disposed between and coupled to the stepped pads of the interconnect substrate and the first contact pads of the wiring board and a second solder bump disposed between and coupled to the base of the interconnect substrate and the second contact pad of the wiring board. The first solder bumps contact the solderable layer at the stepped pads and laterally cover and surround the lower sidewalls of the electrically conductive posts to provide electrical connections between the interconnect substrate and the wiring board, and fills up the wettable depression regions and extend laterally beyond the periphery of the semiconductor package to enable the inspectability of the solder joints. The second solder bump contacts the solderable layer at the base and laterally covers and surrounds the lower sidewall of the base to provide thermal conduction between the interconnect substrate and the wiring board.

The package can be a first-level or second-level single-chip or multi-chip device. For instance, the package can be a first-level package that contains a single chip or multiple chips. Alternatively, the package can be a second-level module that contains a single packaged component or multiple packaged components, and each packaged component can contain a single chip or multiple chips. The chip can be a packaged or unpackaged chip. Furthermore, the chip can be a bare chip, or a wafer level packaged die, etc.

The term "cover" refers to incomplete or complete coverage in a vertical and/or lateral direction and includes contact and non-contact situations. For instance, in a preferred embodiment, the stress buffer partially covers the lateral edges of the electrically conductive flange in a lateral direction, leaving selected portions of the lateral edges of the electrically conductive flange uncovered.

The term "surround" refers to relative position between elements regardless of whether the elements are spaced from or adjacent to one another. For instance, in a preferred embodiment, the inner surrounding sidewall of the stress buffer laterally surrounds the semiconductor device and is spaced from the semiconductor device by the stiffener.

The phrases "mounted on/over" and "attached on/to" include contact and non-contact with a single or multiple element(s). For instance, in a preferred embodiment, the semiconductor device can be attached on the base and is separated from the base by the thermal pad and the thermal adhesive.

The phrases "electrical connection", "electrically connected" and "electrically coupled" refer to direct and indirect electrical connection. For instance, in a preferred embodiment, the semiconductor device is electrically connected to the electrically conductive posts by the bonding wires but does not contact the electrically conductive posts.

The phrase "substantially orthogonal to" refers to deviating not more than 20 degrees from being orthogonal to a plane. In one aspect, substantially orthogonal may mean a relative orientation of from about 70° to about 110°, more preferably from about 80° to about 100°, and most preferably from about 85° to about 95°.

The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional techniques.

The embodiments described herein are exemplary and may simplify or omit elements or steps well-known to those skilled in the art to prevent obscuring the present invention. Likewise, the drawings may omit duplicative or unnecessary elements and reference labels to improve clarity.

What is claimed is:

1. A terminal structure of an interconnect substrate, the terminal structure comprising an electrically conductive post, an electrically conductive flange, and a stress buffer, wherein:
   the electrically conductive post has a top surface, a bottom surface at a first level, and an upper sidewall and a lower sidewall extending between the top surface and the bottom surface thereof and respectively adjacent to the top surface and the bottom surface thereof;

the stress buffer laterally covers and surrounds the upper sidewall of the electrically conductive post, and has a bottom surface at a second level between the top surface and the bottom surface of the electrically conductive post; and the electrically conductive flange extends laterally from the upper sidewall of the electrically conductive post to an outer peripheral edge thereof substantially flush with an outer periphery of the stress buffer, and has a depression surface at a third level between the top surface and the bottom surface of the electrically conductive post to define a depression region therebelow.

2. The terminal structure of claim 1, wherein the stress buffer has an elastic modulus of lower than 10 Gpa.

3. The terminal structure of claim 1, wherein the second level lies between the first level and the third level, or the third level lies between the first level and the second level.

4. The terminal structure of claim 1, wherein the stress buffer has inner lateral surfaces adjacent to the depression surface to define lateral boundaries of the depression region.

5. The terminal structure of claim 1, wherein the lower sidewall of the electrically conductive post is an inwardly tapered sidewall extending from the second level to the first level.

6. The terminal structure of claim 1, further comprising a solderable layer, which covers the depression surface of the electrically conductive flange, the bottom surface of the electrically conductive post, and a lateral surface of the electrically conductive post to form a stepped pad with a wettable depression region at a periphery of the interconnect substrate.

7. The terminal structure of claim 1, wherein a height difference between the first level and the third level is 50 micrometers or more.

8. A semiconductor package, comprising:

an interconnect substrate, including a base, a plurality of electrically conductive posts, a plurality of electrically conductive flanges and a stress buffer;

a semiconductor device, disposed over the base and electrically connected to the electrically conductive posts; and a stiffener, encapsulating the semiconductor device;

wherein the base has a top side with the semiconductor device mounted thereon, a bottom side at a first level, and an upper sidewall and a lower sidewall extending between the top side and the bottom side thereof and respectively adjacent to the top side and the bottom side thereof;

wherein the electrically conductive posts are spaced from each other and the base and each has a top surface covered by the stiffener, a bottom surface at the first level, and an upper sidewall and a lower sidewall extending between the top surface and the bottom surface thereof and respectively adjacent to the top surface and the bottom surface thereof;

wherein the stress buffer laterally covers and surrounds the upper sidewalls of the electrically conductive posts and the upper sidewall of the base, and has a top surface covered by the stiffener and a bottom surface at a second level between the top surface and the bottom surface of each the electrically conductive posts; and wherein the electrically conductive flanges each extend laterally from the upper sidewall of a respective one of the electrically conductive posts to an outer peripheral edge thereof substantially flush with an outer periphery of the stress buffer, and each has a top surface covered by the stiffener and a depression surface at a third level between the top surface and the bottom surface of each the electrically conductive posts to define a depression region therebelow.

9. The semiconductor package of claim 8, wherein the stress buffer has an elastic modulus lower than that of the stiffener.

10. The semiconductor package of claim 8, wherein the stress buffer has an elastic modulus lower than 10 Gpa.

11. The semiconductor package of claim 8, wherein the second level lies between the first level and the third level, or the third level lies between the first level and the second level.

12. The semiconductor package of claim 8, wherein the stress buffer has inner lateral surfaces adjacent to the depression surface to define lateral boundaries of the depression region.

13. The semiconductor package of claim 8, wherein the lower sidewall of each of the electrically conductive posts and the base is an inwardly tapered sidewall extending from the second level to the first level.

14. The semiconductor package of claim 8, wherein the interconnect substrate has a cavity defined by an inner surrounding sidewall of the stress buffer and the top side of the base.

15. The semiconductor package of claim 8, wherein the interconnect substrate further includes a solderable layer, which covers the bottom side of the base, the depression surfaces of the electrically conductive flanges, the bottom surfaces of the electrically conductive posts, and lateral surfaces of the electrically conductive posts to form stepped pads each with a wettable depression region at a periphery of the semiconductor package.

16. A semiconductor assembly, comprising:

a semiconductor package, including a plurality of the terminal structures as claimed in claim 6;

a wiring board, including a plurality of contact pads; and a plurality of solder bumps disposed between and coupled to the stepped pads of the terminal structures and the contact pads of the wiring board;

wherein the solder bumps contact the solderable layer and laterally cover and surround the lower sidewalls of the electrically conductive posts, fills up the wettable depression regions and extend laterally beyond a periphery of the semiconductor package.

17. The semiconductor assembly of claim 16, wherein the stress buffer has an elastic modulus of lower than 10 Gpa.

18. The semiconductor assembly of claim 16, wherein the second level lies between the first level and the third level, or the third level lies between the first level and the second level.

19. The semiconductor assembly of claim 16, wherein the lower sidewalls of the electrically conductive posts are inwardly tapered sidewalls extending from the second level to the first level.

20. The semiconductor assembly of claim 16, wherein a height difference between the first level and the third level is 50 micrometers or more.

* * * * *